US012601621B2

(12) United States Patent
Jorgensen et al.

(10) Patent No.: US 12,601,621 B2
(45) Date of Patent: Apr. 14, 2026

(54) METHODS OF MANUFACTURING PLASMA GENERATING CELLS FOR A PLASMA SOURCE

(71) Applicant: APPLIED MATERIALS, INC., Santa Clara, CA (US)

(72) Inventors: David John Jorgensen, Mountain View, CA (US); Jian Wu, San Jose, CA (US); Vladimir Nagorny, Tracy, CA (US); Hugo Rivera, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 858 days.

(21) Appl. No.: 17/853,584

(22) Filed: Jun. 29, 2022

(65) Prior Publication Data

US 2023/0319971 A1 Oct. 5, 2023

(51) Int. Cl.
*G01F 1/56* (2006.01)
*B81B 7/00* (2006.01)
(Continued)

(52) U.S. Cl.
CPC .............. *G01F 1/56* (2013.01); *B81B 7/0058* (2013.01); *B81B 7/0061* (2013.01); *B81C 1/00301* (2013.01); *B81C 1/00309* (2013.01); *C23C 16/45504* (2013.01); *C23C 16/45544* (2013.01); *C23C 16/45557* (2013.01); *C23C 16/45561* (2013.01); *G01F 1/688* (2013.01); *H05H 1/2418* (2021.05); *H10W 20/087* (2026.01); *B81B 2201/0292* (2013.01); *B81B 2203/04* (2013.01); *B81B 2207/093* (2013.01);
(Continued)

(58) Field of Classification Search
CPC ............................ H05H 1/2406; H05H 1/241
See application file for complete search history.

(56) References Cited

U.S. PATENT DOCUMENTS

| 3,962,002 A | * | 6/1976 | Finkbeiner | ............... B41J 2/395 |
| | | | | 430/394 |
| 5,250,469 A | | 10/1993 | Tanaka et al. | |

(Continued)

FOREIGN PATENT DOCUMENTS

| EP | 0318395 A2 | 5/1989 |
| JP | 2016075506 A | 5/2016 |

(Continued)

OTHER PUBLICATIONS

International Search Report and Written Opinion for International Application No. PCT/US2023/011065, mailed May 10, 2023, 11 Pages.

(Continued)

*Primary Examiner* — James M Mellott
(74) *Attorney, Agent, or Firm* — Lowenstein Sandler LLP

(57) ABSTRACT

A method of manufacturing a dielectric barrier discharge (DBD) structure includes forming a patterned electrode layer around an outer perimeter of a substrate composed of a dielectric material. The patterned electrode layer includes multiple electrodes around the outer perimeter of the substrate and gaps between adjacent electrodes. The method further includes depositing a dielectric layer over at least a first region of the patterned electrode layer to form a DBD region of the DBD structure.

20 Claims, 8 Drawing Sheets

450

(51) Int. Cl.

| | |
|---|---|
| *B81C 1/00* | (2006.01) |
| *C23C 16/455* | (2006.01) |
| *G01F 1/688* | (2006.01) |
| *H01J 37/32* | (2006.01) |
| *H01L 21/768* | (2006.01) |
| *H05H 1/24* | (2006.01) |
| *H10W 20/00* | (2026.01) |

(52) U.S. Cl.
CPC .. *B81C 2203/019* (2013.01); *B81C 2203/035* (2013.01); *B81C 2203/036* (2013.01); *B81C 2203/054* (2013.01); *H01J 37/3244* (2013.01); *H01J 2237/24585* (2013.01)

(56) References Cited

U.S. PATENT DOCUMENTS

| | | | |
|---|---|---|---|
| 6,382,023 | B1 | 5/2002 | Yonezawa et al. |
| 6,489,585 | B1* | 12/2002 | Nakamura ........ H01J 37/32009 |
| | | | 219/121.48 |
| 6,640,627 | B2 | 11/2003 | Sato et al. |
| 12,061,103 | B2 | 8/2024 | Krishnamurthy et al. |
| 2001/0048158 | A1 | 12/2001 | Lin |
| 2002/0030437 | A1* | 3/2002 | Shimizu ................ H01J 61/305 |
| | | | 313/495 |
| 2004/0035201 | A1 | 2/2004 | Vincze et al. |
| 2005/0179395 | A1 | 8/2005 | Pai |
| 2007/0170866 | A1* | 7/2007 | Eden ....................... G21F 1/106 |
| | | | 313/631 |
| 2008/0023829 | A1 | 1/2008 | Kok et al. |
| 2008/0212162 | A1 | 9/2008 | Ichikawa et al. |
| 2009/0301567 | A1 | 12/2009 | Lane et al. |
| 2011/0146398 | A1 | 6/2011 | Beck et al. |
| 2013/0139584 | A1 | 6/2013 | Qasimi et al. |
| 2014/0217882 | A1* | 8/2014 | Yagi ....................... B01J 19/088 |
| | | | 313/268 |
| 2014/0360262 | A1 | 12/2014 | Asano et al. |
| 2017/0323772 | A1* | 11/2017 | Fenwick ........... H01J 37/32559 |
| 2018/0023995 | A1 | 1/2018 | Govyadinov et al. |
| 2018/0330923 | A1* | 11/2018 | Tran ....................... C23C 16/04 |
| 2019/0391602 | A1 | 12/2019 | Xu et al. |
| 2020/0209034 | A1 | 7/2020 | Uenodan et al. |
| 2020/0246897 | A1 | 8/2020 | Zapf et al. |
| 2021/0167235 | A1* | 6/2021 | Li ......................... H10F 77/311 |
| 2021/0235573 | A1* | 7/2021 | Mujahid .............. H05H 1/2406 |

FOREIGN PATENT DOCUMENTS

| | | |
|---|---|---|
| KR | 101417273 B1 | 8/2014 |
| KR | 101866545 B1 | 6/2018 |
| TW | 201213775 A | 4/2012 |
| TW | 202130980 A | 8/2021 |
| WO | 2017061735 A1 | 4/2017 |
| WO | 2019049513 A1 | 3/2019 |
| WO | 2019195292 A1 | 10/2019 |
| WO | 2021065036 A1 | 4/2021 |
| WO | 2022058333 A1 | 3/2022 |

OTHER PUBLICATIONS

International Search Report and Written Opinion for International Application No. PCT/US2023/011256, mailed May 12, 2023, 11 Pages.

International Search Report and Written Opinion for International Application No. PCT/US2023/011360, mailed May 11, 2023, 11 Pages.

International Search Report and Written Opinion for International Application No. PCT/US2023/026339, mailed Oct. 16, 2023, 10 Pages.

* cited by examiner

100C

102

100D

102

300C

300D

500A

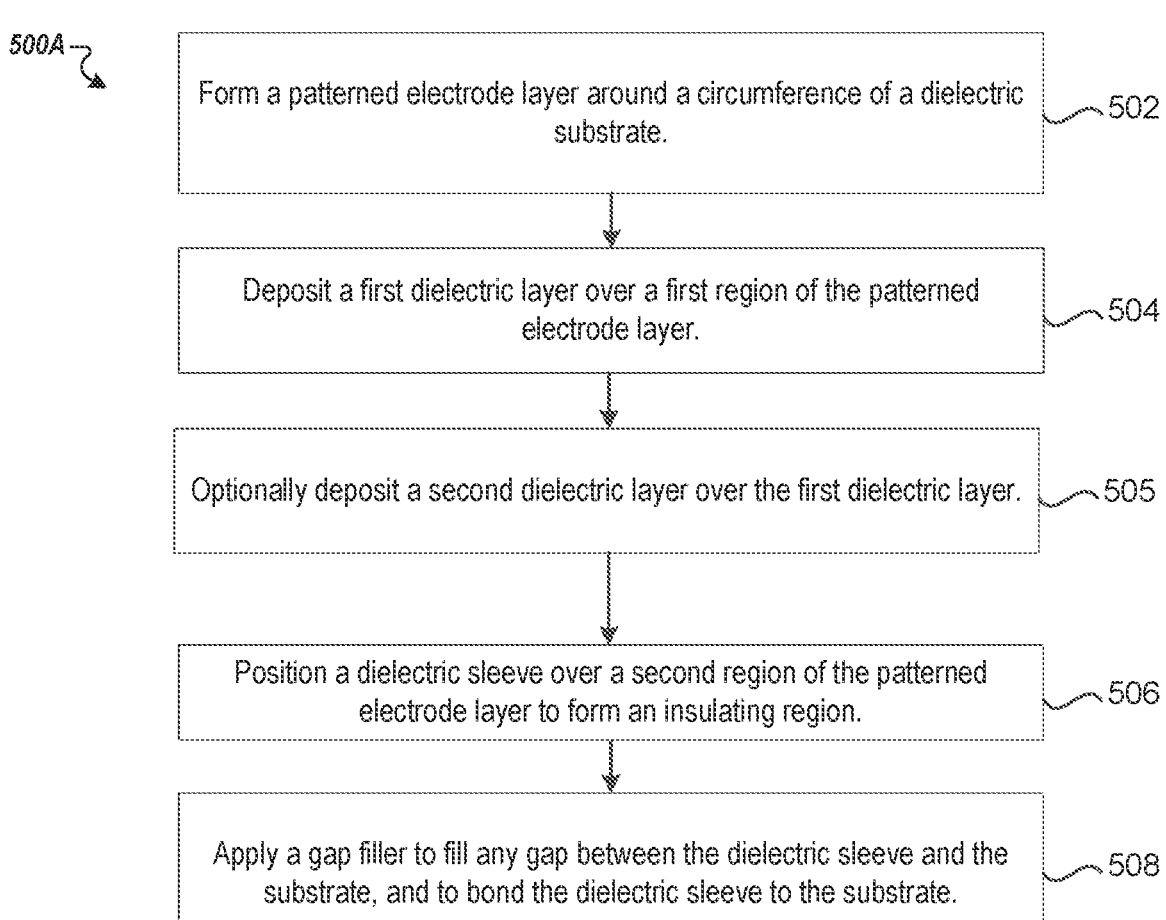

Form a patterned electrode layer around a circumference of a dielectric substrate. — 502

Deposit a first dielectric layer over a first region of the patterned electrode layer. — 504

Optionally deposit a second dielectric layer over the first dielectric layer. — 505

Position a dielectric sleeve over a second region of the patterned electrode layer to form an insulating region. — 506

Apply a gap filler to fill any gap between the dielectric sleeve and the substrate, and to bond the dielectric sleeve to the substrate. — 508

FIG. 5A

500B

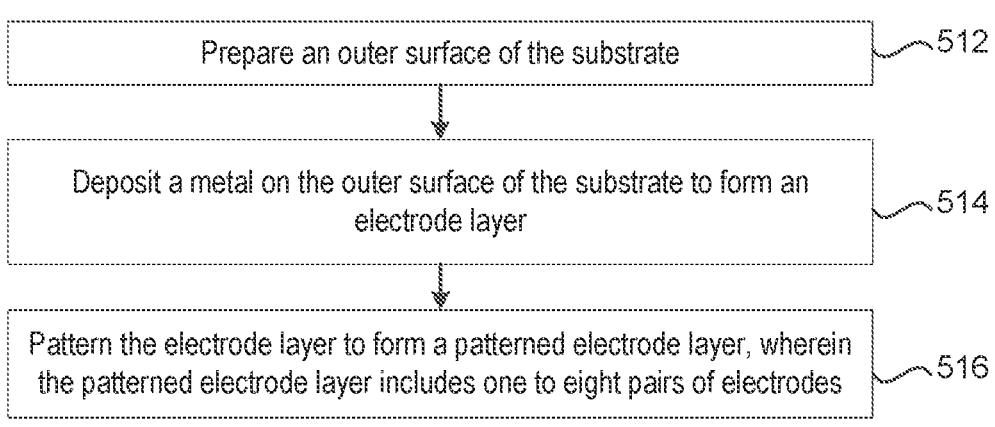

Prepare an outer surface of the substrate — 512

Deposit a metal on the outer surface of the substrate to form an electrode layer — 514

Pattern the electrode layer to form a patterned electrode layer, wherein the patterned electrode layer includes one to eight pairs of electrodes — 516

Deposit a mask layer over the outer surface of the substrate — 522

Pattern the mask layer to expose a plurality of surface regions of the substrate — 524

Deposit a metal layer over the mask layer and the plurality of exposed surface regions of the substrate — 526

Remove the mask layer — 528

METHODS OF MANUFACTURING PLASMA GENERATING CELLS FOR A PLASMA SOURCE

TECHNICAL FIELD

The instant specification relates to methods of manufacturing components used for controlling plasma processing. Specifically, the instant specification relates to methods of manufacturing electrode rods used in a plasma source such as a stackable plasma source for plasma processing.

BACKGROUND

Plasma processing is widely used in the semiconductor industry. Plasma can modify a chemistry of a processing gas (e.g., generating ions, radicals, etc.), creating new species, without limitations related to the process temperature, generating a flux of ions to the wafer with energies from a fraction of an electronvolt (eV) to thousands of eVs. There are many kinds of plasma sources (e.g., capacitively coupled plasma (CCP), inductively coupled plasma (ICP), microwave generated plasma, electron cyclotron resonance (ECR), and the like) that cover a wide operational process range from a few mTorr to a few Torr.

A common plasma process specification today is a high uniformity of the process result (e.g., a uniformity across a wafer up to the very edge of the wafer). For example, process uniformity specifications in today's semiconductor manufacturing may include targets around 1%-2% across the whole wafer, with exclusion of 1-3 mm from the edge of the wafer. These stringent constraints continuously get even firmer as researchers look for new methods for controlling process uniformity and/or finding improvements to existing methods for controlling process uniformity. Different uniformity controlling methods may be effective for some processes and completely useless for others.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an exemplary embodiment, a method of manufacturing a dielectric barrier discharge (DBD) structure includes forming a patterned electrode layer around a circumference of a substrate composed of a dielectric material. The patterned electrode layer includes a plurality of electrodes around the circumference of the substrate and gaps between adjacent electrodes of the plurality of electrodes. The method further includes depositing a dielectric layer over at least a first region of the patterned electrode layer to form a DBD region of the DBD structure.

In an exemplary embodiment, a method includes roughening a surface of a dielectric rod by an abrasive machining operation or a media blasting operation to form a roughened surface of the dielectric rod. The method further includes depositing an electrode layer on the roughened surface of the dielectric rod by a metallization process or by an electron beam ion-assisted deposition (EB-IAD) process. The electrode layer includes at least one of a metal, a metal alloy, or a conductive oxide. The method further includes removing at least a portion of the electrode layer by a machining process or by an etching process to form a plurality of gaps in the electrode layer. Each gap of the plurality of gaps separates an electrode from an adjacent electrode. The method further includes depositing a dielectric layer over at least a first region of the electrode layer to form a dielectric barrier discharge region.

In an exemplary embodiment a method includes smoothing a surface of a dielectric rod by a polishing operation to form a smoothed surface of the dielectric rod. The method further includes depositing a mask layer over at least the smoothed surface of the dielectric rod. The method further includes patterning the mask layer to expose a plurality of electrode regions on the smoothed surface of the dielectric rod. The method further includes depositing a metal layer or a conductive oxide layer over the mask layer and the plurality of electrode regions to form a plurality of electrodes on the plurality of electrode regions. The method further includes removing the mask layer to form a plurality of gaps. Each gap of the plurality of gaps separates an electrode from an adjacent electrode. The method further includes depositing a dielectric layer over at least a first region of the plurality of electrodes to form a dielectric barrier discharge region.

BRIEF DESCRIPTION OF THE DRAWINGS

The present disclosure is illustrated by way of example, and not by way of limitation in the figures of the accompanying drawings.

FIG. 2 illustrates a chamber body housing a plasma source, according to certain embodiments.

FIGS. 5A-C are flow charts of methods of manufacturing plasma generating cells of a stackable plasma source, according to certain embodiments.

DETAILED DESCRIPTION

Figure 1A:
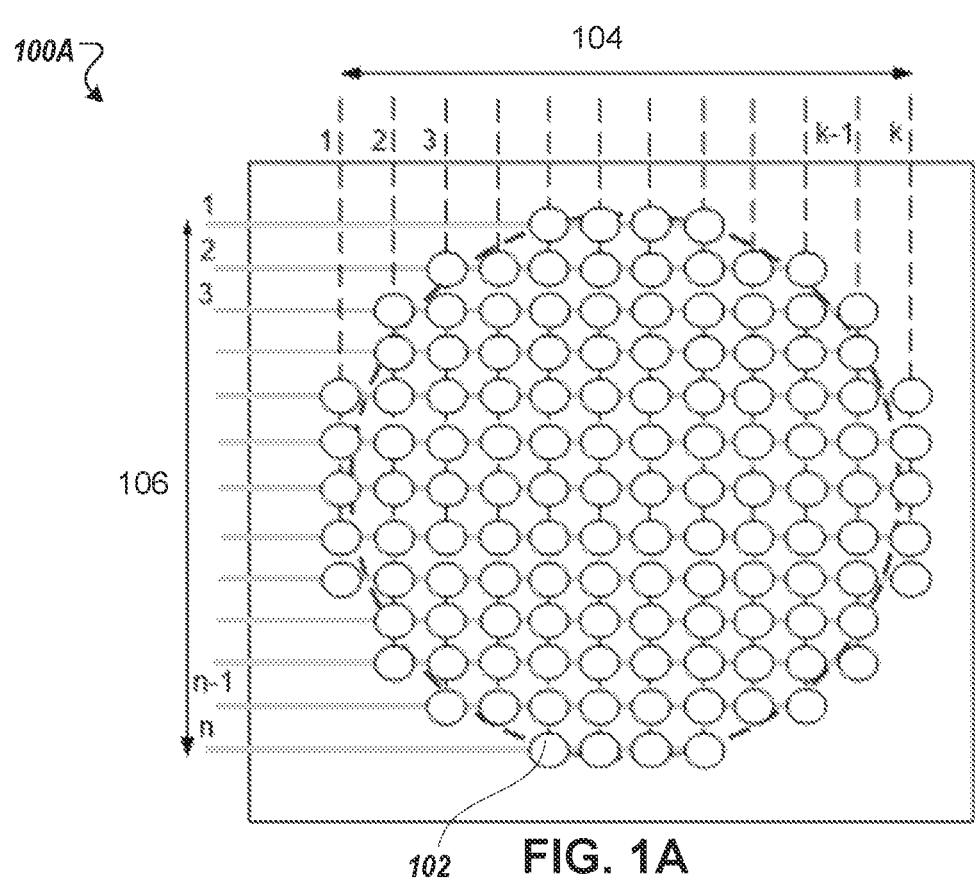
FIGS. 1A-D illustrate a plasma source with a configuration of plasma generating cells, according to aspects of the disclosure.

A common goal for a plasma process today is a high uniformity of a process result (e.g., a uniformity across a wafer up to the very edge of the wafer). This goal is often very difficult to achieve, because it involves many factors, many of which interfere with others. Plasma uniformity, chamber design, wafer temperature distribution, design of the bias electrode, etc. are only part of those factors. Typical process uniformity target in today's semiconductor manufacturing is around 1%-2% across the whole wafer, with exclusion of 1-3 mm from the edge. Different uniformity controlling methods may be effective for some processes and completely useless for others. These stringent constraints that continuously get even firmer call for new methods for controlling process uniformity instead of or in addition to existing methods.

These problems can be mitigated, and in some cases eliminated, if a traditional hardware architecture which uses a few powered elements (1-2 coils; 1-2 zone electrostatic chuck (ESC), etc.) and, respectively, very few controlling elements that control plasma globally, is replaced with a hardware that uses hundreds of controlled elements, each of which affects only a small local area of the wafer or other processed substrate (e.g., glass plate). An analog process control used in traditional systems can be replaced with a digital process control. Digital control is a native approach for control of a lot of identical or similar controlled elements/cells (e.g. 200-1000 zones ESC, etc.). Contrary to analog systems, where those few elements operate for the same time, but are energized to carefully adjusted/controlled levels, in a digitally controlled system one may energize/activate every cell (e.g., pixel) to the same level (e.g. powered), however, the exposure time of each cell may be controlled.

For example, a common plasma source may be replaced with a two-dimensional (2D) array of small identical or similar plasma sources that cover the whole area above the substrate and are powered by the same power supply. The controllable version of this array allows turning ON and OFF individual sources or zones, where each zone may contain several sources and the number of sources may differ from zone to zone. Controlling the time the individual zone or the source generates plasma (ON), one controls the process uniformity on the substrate. A difficulty of this approach lies in the manufacturing of the plasma sources that can survive vacuum conditions and/or processing temperatures that can be anything from the room temperature to a few hundred Centigrade (e.g., 400° C.-800° C.). Early designs of individual plasma sources (e.g., plasma cells) include electrical connections (e.g., wires) to electrically couple connection points (for connecting to an external power source) at a first distal end of the plasma source with electrodes disposed at a second distal end of the plasma source. The wires are often internal to the plasma source. Thus, early designs of the plasma sources include seals (e.g., vacuum seals, sealing interfaces, etc.) where the wires contact the electrodes and/or where the wires are to contact external power leads. These internal wires and associated seals may lead to premature failure of the individual plasma sources and may introduce manufacturing difficulties.

Aspects and implementations of the present disclosure address these and other potential shortcomings of this technology using advanced methods to manufacture the individual plasma sources (e.g., plasma cells, dielectric barrier discharge (DBD) structures, etc.). In an exemplary embodiment, a substrate is provided having a circular cross section or a cross section having a different shape. The substrate may be substantially rod-shaped (e.g., may be a rod). A patterned electrode layer may be formed around the outer perimeter of the substrate. The patterned electrode layer may include multiple pairs of electrodes and gaps separating each pair of adjacent (e.g., neighboring) electrodes. The electrodes may extend from a first distal end of the substrate to a second distal end (e.g., an opposite end) of the substrate (e.g., from a top to a bottom of the rod). The electrodes may be a deposited metal as described herein. The electrodes disposed on the exterior of the substrate/rod may be configured to conduct electricity from a connection (e.g., an electrical connection to an external power source) to a DBD region as explained herein. The electrodes acting as conductors (e.g., electrical conductors) between the connection to the power source and the DBD region eliminates the wires and seals, etc. of the early designs of the individual plasma sources. A dielectric layer may be deposited over a region of the patterned electrode layer proximate the second distal end of the substrate. The dielectric layer may electrically insulate the electrodes from one another, forming the DBD region. The DBD region may substantially form a capacitor. In some embodiments, a dielectric sleeve may be positioned over a region of the patterned electrode layer to electrically insulate the patterned electrode layer from a support structure when the individual plasma source is installed and in operation.

FIGS. 1A-D illustrate a plasma source with a configuration 100A-D of plasma generating cells 102 of a plasma source, according to aspects of the disclosure. In some embodiments, the plasma generating cells include a set of addressable plasma elements. In some embodiments, the array of plasma generating cells (e.g., identical or similar plasma generating cells) can be individually addressed to an ON or OFF state. An ON state is associated with activation of plasma generation and an OFF state may be associated with deactivation of plasma generation. For example, the addressable plasma elements can use dielectric barrier discharge (DBD) technology, which allows independent operation of each individual cell 102 (e.g., mini-source), using selection capability (addressing) of a cell 102 (e.g., DBD cell). Alternatively, the addressable plasma elements can include individually addressable shutters. An advantage of dielectric barrier discharge is that a common voltage waveform from a single power supply can be applied (e.g., configured to supply) simultaneously to all cells 102, but discharges will occur only in previously selected (addressed) cells, which can have natural memory capability without requiring additional memory holding elements. The remaining cells 102 will be idle (no discharge). An alternating voltage (±Vs) at frequency f from a power supply (e.g., AC generator) can generate a series of identical discharge pulses of the 2f frequency in those selected cells. A discharge pulse can occur after every change of polarity, and the total amount of plasma related particles (ions, electrons, radicals) generated in any cell is proportional to the number of pulses generated in that cell.

A combination of different durations can be used to generate exposure patterns with independent activation and deactivation of the cells 102. In some embodiments, exposure patterns include data having a set of exposure durations mapped to individual plasma elements. The plasma elements may be oriented in a grid with individual activation instructions stored in an exposure file (e.g., an image file). In some embodiments, an exposure pattern may include duration values in different formats (e.g. quantities of time, number of plasma pulses, etc.) that can be mapped to the cells 102 such that each cell 102 permits passage or generate plasma related fluxes for an associated exposure duration.

As shown in FIG. 1A, the cells 102 may be disposed in an organized structure (e.g., a grid, a shape, etc.). Each cell 102 may be given an address in two dimensional space (X, Y) or (Z, Y) (e.g., axis 104 and axis 106). The former uses 2 electrodes structure, so both electrodes are used for both addressing and sustaining. The latter uses 3 electrodes, where additional electrodes are used together with Y (scan) electrode only for addressing, and X and Y electrodes are used for sustaining discharge. Both addressing and sustaining schemes can be used to address the electrodes. For example, a cell may be assigned an address with an X address (e.g., address on axis 104) and a Y address (e.g., address on axis 106). In some embodiments, an exposure pattern (also known as an exposure map) can include a large array $t_{ik}$, or $N_{ik}$, where N is the number of pulses, and (i, k) is a node of the array with ($x_i$, $y_k$) coordinate of the (i, k)'s where the address identified in the exposure image corresponds with an address of a cell of the set of plasma generating cells 102. For example, an address in the exposure pattern may contain data indicative of a time duration or exposure duration an associated addressable node (or cell) is to activate during a plasma process. Each cell may be individually controlled for independent activation and/or deactivation of the plasma cells.

Figure 1B:
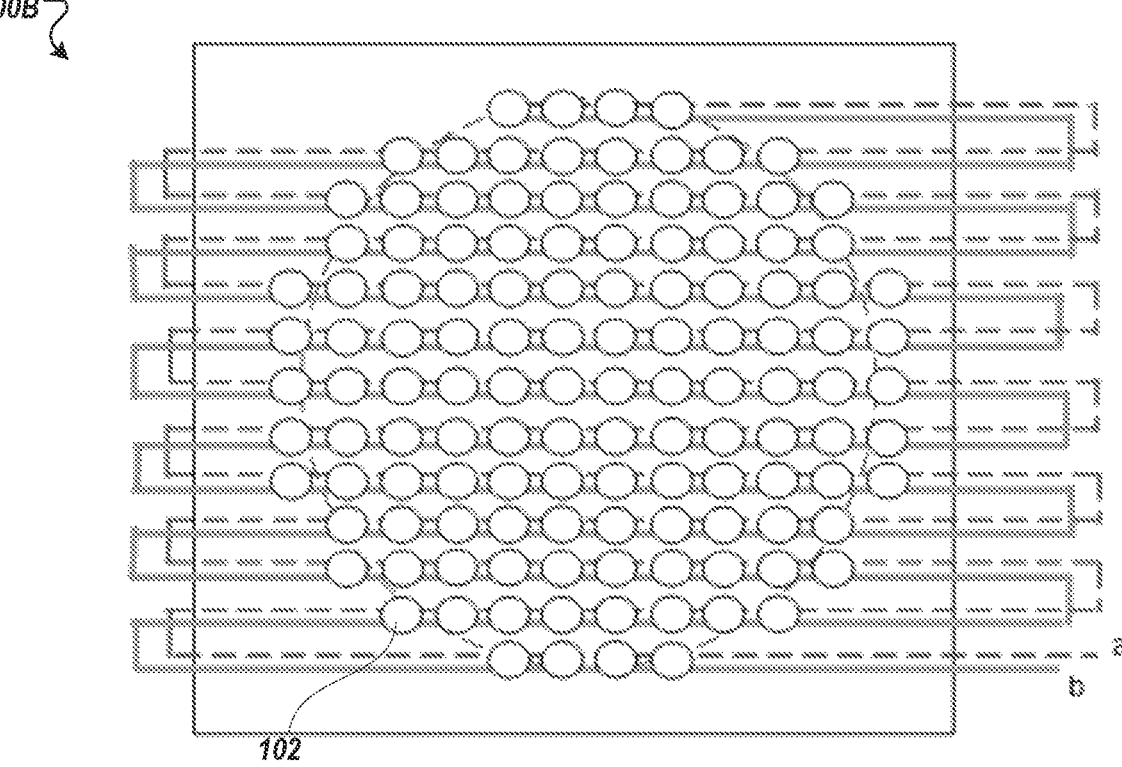

As shown in FIG. 1B, the cells 102 may be disposed in an organized structure (e.g., a grid, a shape, etc.). Each cell may be couple to a neighboring cell such that all the cells in the configuration 100B are controlled together. For example, when a first cell of the configuration 100B of plasma cells 102 is activated the entirety of the array of cells is also activated. The branching of the electric leads may be configured such that an A branch direct an electric signal a first direction through the plasma cells and a B branch directs the electric signal a second direction. As will be discussed later the electric lead my cause the plasma cells to activate and generate plasma such as for, example, plasma used for substrate processing.

Figure 1C:
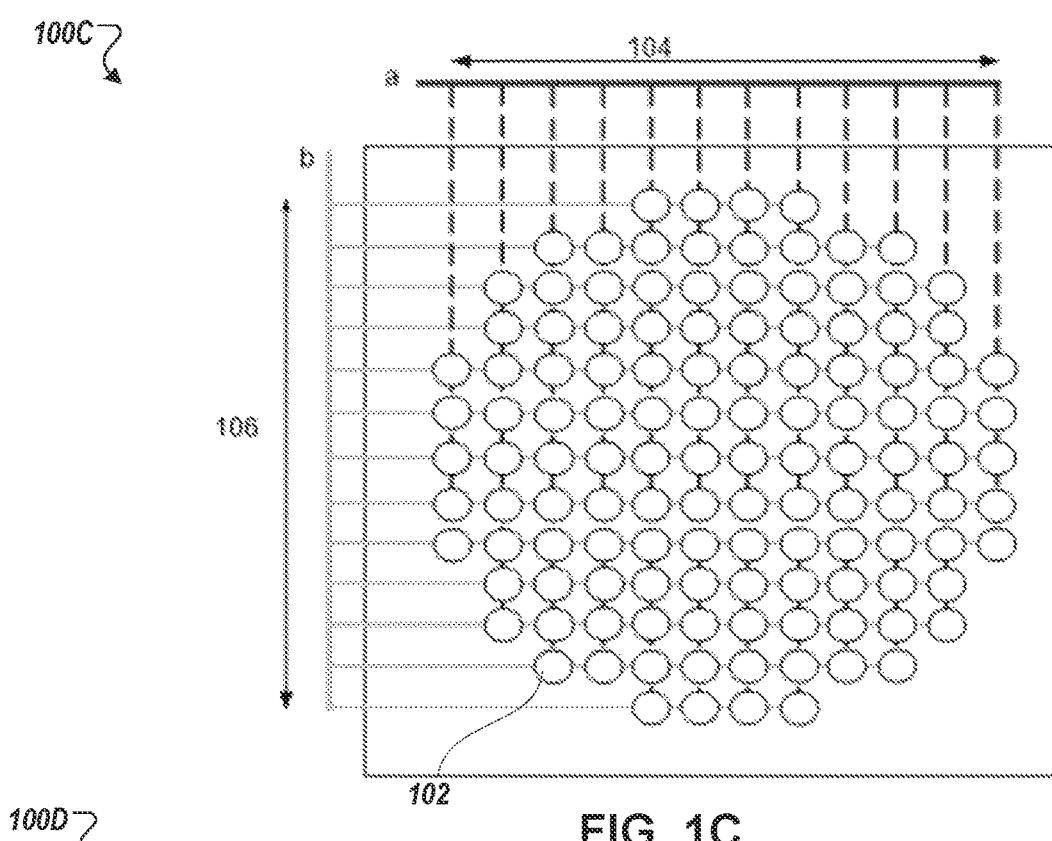

As shown in FIG. 1C, the cells 102 may be disposed in an organized structure (e.g., a grid, a shape, etc.). Each cell may include a first electric lead that corresponds to a first axis 104 and a second lead that corresponds to a second axis 106. In this configuration, each of the cells may be controlled together (e.g., activated/deactivated one with another). Each of the cells may be connected to other plasma cells in the same column using a first lead and other plasma cells in the same row with a second lead, as shown in FIG. 1C.

Figure 1D:
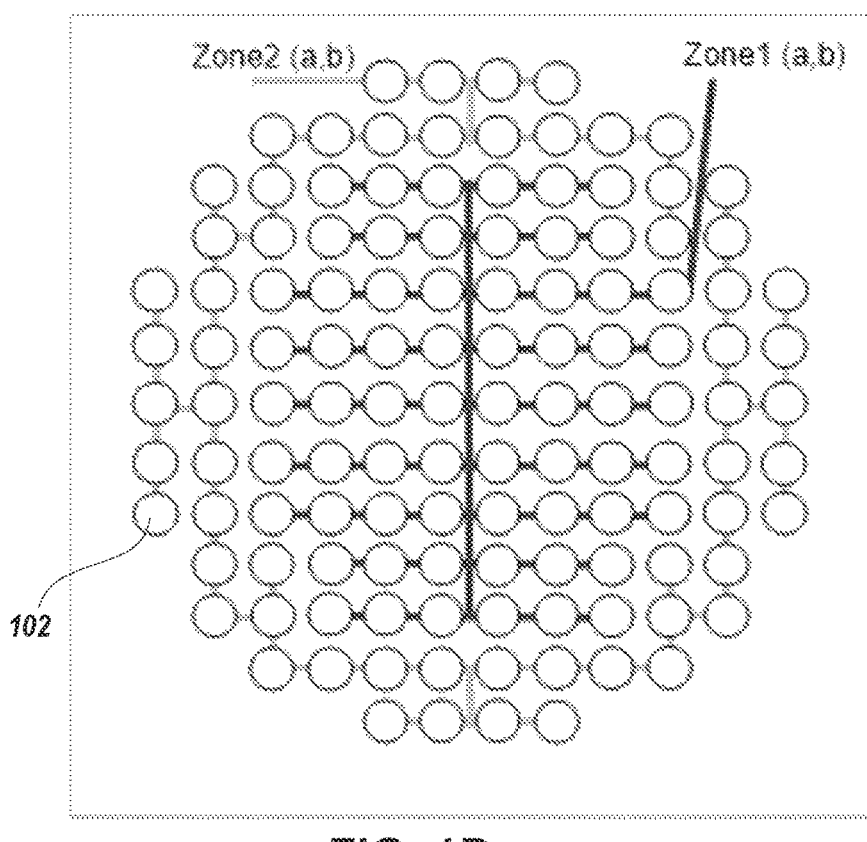

As shown in FIG. 1D, the cells 102 may be disposed in an organized structure (e.g., a grid, a shape, etc.). The cells may be divided into individual zones and wired such that plasma cells that are in the same zone are activated/deactivated together. For example, a first zone illustrated by the cells coupled to the darker "Zone 1 (a,b)" line are wired to be in the first zone and a second zone illustrate by the cells coupled to the lighter "Zone 2 (a,b)" are representative of the second zone. The zones may be divided into positions of the array such as a central zone and a boundary zone as shown in FIG. 1D.

In some embodiments, the cells wired as shown in FIG. 1A may be controlled like the configurations 100B-C illustrate in FIG. 1B-D by selective addressing and activation/deactivation of the individual cells. Each of the cells 102 may comprise a dielectric rod with one or more pair of electrodes disposed about a perimeter of the dielectric rod. The electrodes may extend from a top of the dielectric rod to a bottom of the dielectric rod. At least a region of the electrodes may be coated with a dielectric layer. Plasma discharge may be generated at gaps between pairs of electrodes. In some embodiments, the cells 102 are manufactured according to embodiments described herein.

Figure 2:
FIG. 2 illustrates a plasma processing system including a plasma generation assembly and a chamber body housing a plasma source, according to certain embodiments.

FIG. 2 illustrates a plasma processing system 200 including a plasma generation assembly 202 and a chamber body 214 housing a plasma source, according to certain embodiments. The processing system 200 may include a processing chamber 210 and a plasma source 202. A plasma source 202 includes walls 220 (e.g., to hold maintain a vacuum and or a gas delivery volume 204), a gas inlet 212, the gas delivery volume 204 limited by the walls 220 and a plasma generation assembly 230. Processing chamber 210 includes chamber body 214 that holds inside vacuum and provides support to the plasma source 202, substrate support structure 208, and gas outlet 216. The gas inlet 212, plasma generation assembly 230 and gas outlet 216 may provide a flow of feed gas through the processing system under processing gas pressure. The feed gas may comprise any of air, $O_2$, $N_2$, Ar, $NH_3$, He, and/or other appropriate processing gases. Plasma source 202 may include a gas expansion volume of a gas injector (e.g. without plasma). The plasma source 202 may be designed to deliver plasma (e.g., generating or facilitating flow into) to a processing chamber 210. The plasma source delivers plasma through plasma generation assembly 230. The processing chamber 210 houses a substrate disposed on a substrate support structure 208 to be processed by the processing system 200. The processing system 200 may be a plasma chamber including an etch chamber, deposition chamber (including atomic layer deposition, chemical vapor deposition, physical vapor deposition), and so on. For example, the plasma chamber may be a chamber for a plasma etcher, a plasma cleaner, and so forth.

The plasma generation assembly 230 may include a holding structure (sometimes referred to as a support structure) and an arrangement of plasma generating cells (e.g., plasma generating cells 102 of FIGS. 1A-D) selectively coupled (e.g., easily removable from but maintaining a position and/or orientation when coupled) to the holding structure. In some embodiments, the holding structure includes a frame or carcass for holding each of the plasma generating cells.

The plasma generation assembly 230 is positioned above a substrate positioned on the substrate support structure 208. The plasma source 202 forms an interior volume that functions as a gas delivery volume 204. Feed gas is received by the gas inlet 212 and is delivered to the various plasma generation cells of plasma generation assembly 230. For example, the feed gas enters the gas distribution volume 204, spreads above the plasma generation assembly 230 and enters the plasma cells. Plasma is generated in cells placed in the holding structure together forming the plasma generation assembly 230. Plasma is supplied to the processing chamber 210. In some aspects, plasma is prevented from flowing into the gas distribution volume 204.

Figure 3A:
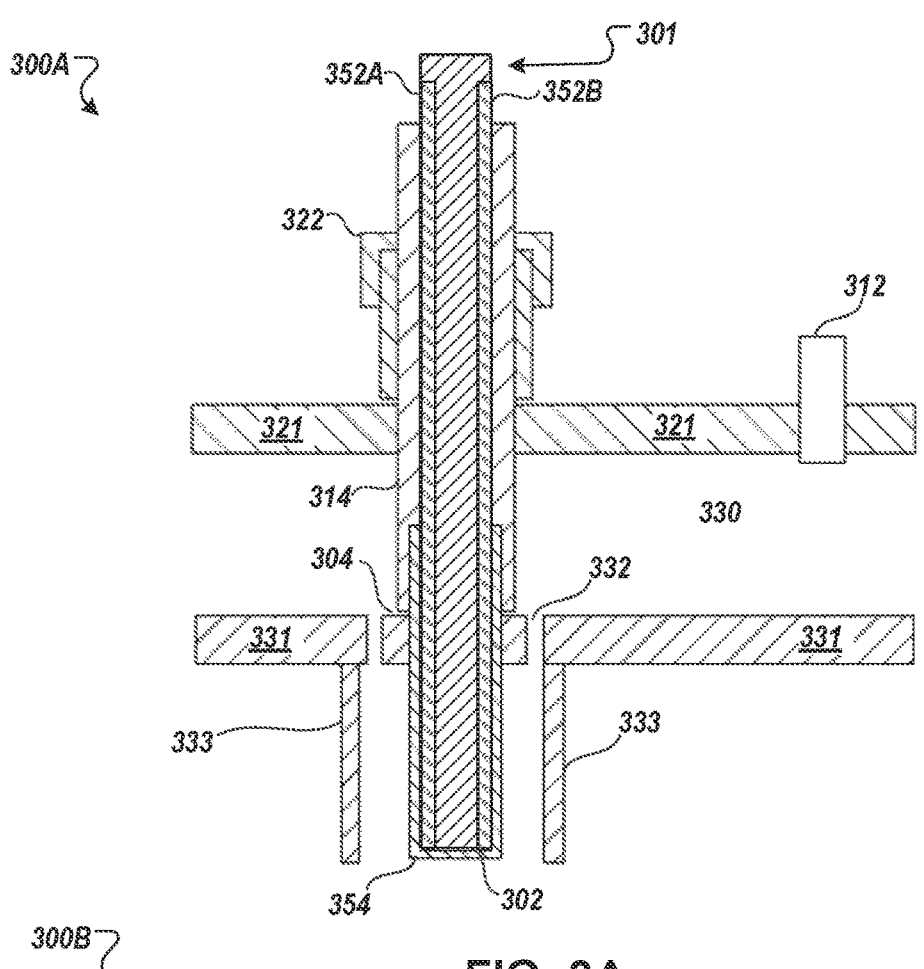
FIG. 3A illustrates a plasma generating cell of a stackable plasma source, according to certain embodiments.

FIG. 3A illustrates a plasma generating element 301 of a stackable plasma source 300A, according to certain embodiments. Portions of the stackable plasma source 300A (e.g., connection structure 302, walls 333, electrodes 352A-B, dielectric layer 354, etc.) may correspond to a cell 102 of FIGS. 1A-D in some embodiments.

The stackable plasma source 300A may include elements discussed in association with other figures described herein. For example, the stackable plasma source 300A may include a connection structure 321 (e.g., a cover structure, a metal plate, a top of a processing chamber, etc.) and a holding structure 331 (e.g., a shell structure, a carcass, a ceramic panel, etc.). The connection structure 302 and the holding structure 331 may form a region 330 that directs process gas flow to plasma generation cells 300B. The process gas may be directed into region 330 using gas ingress structure 312. In some embodiments, gas ingress structure 312 may correspond with gas inlet 212 of FIG. 2.

The stackable plasma source 300A includes plasma generation cells (only one illustrated in FIG. 3A) coupled to the connection structure 321 and the holding structure 331. The plasma generation cells 301 include a base structure 302 (e.g., a rod) with a set of electrodes. The base structure 302 may be a dielectric substrate or a dielectric rod. The base structure may be solid, or may be hollow (e.g., a tube) with one or both ends plugged. The base structure may have any shape of a cross section, such as a cross section with a circular shape, a square shape, a rectangular shape, a pentagonal shape, a hexagonal shape, and so on. In some examples, the base structure 302 is made up of a dielectric material. In some examples, the base structure 302 is made of alumina, quartz, or sapphire. However, the base structure 302 may be made of other materials consistent with the description provided herein. The holding structure 331 includes walls 333 disposed between plasma generation cells 301 (only one plasma generation cell is illustrated, but similar to other embodiments, an arrangement (e.g., an array) of plasma generation cells may be incorporated in the stackable plasma source 300A. The plasma generation cells are designed to receive process gas through channels 332 of the holding structure 331 from region 330 and generate plasma related fluxes 324. In some embodiments, the holding structure 331, the channels 332, and/or the walls 333 may correspond to plasma generation assembly 230 of FIG. 2.

As shown in FIG. 3A the base structure may include electrodes 352A-B that extend along an outer surface of the base structure 302. In some embodiments, the electrodes are deposited onto the surface of the base structure 302 along an outer perimeter of the base structure 303. A bottom portion of the base structure 302 may further be covered with a thin dielectric layer 354 to form a dielectric barrier discharge region (e.g., DBD region). For example, electrodes 352A-B may be sufficiently covered as to not be exposed at any point below the holding structure 331 (e.g., the electrodes 352A-B are not exposed to vacuum conditions of a processing chamber). The base structure 302 may be inserted into a stem structure 314. The stem structure 314 may extend through connection element 322. Connection element 322 and connection structure 321 may correspond to walls 220 of FIG. 2, in some embodiments. In some embodiments, the stem structure 314 is a dielectric sleeve (e.g., a dielectric insulating layer) to electrically insulate the electrodes 352 from the connection structure 321 and/or the holding structure 331. In some embodiments, the joint between the base structure 302 and the stem structure 314 form a seal. In some embodiments, the stem structure 314 is an insulator configured to electrically insulate the electrodes from the connection structure 321. In some embodiments, the stem structure 314 is a dielectric that is deposited onto the base structure 302 as described herein. In some embodiments, the base structure 302, the electrodes 352, the dielectric layer 354, and/or the stem structure 314 (e.g., dielectric sleeve, dielectric insulating layer, etc.) may form a DBD structure.

As shown in FIG. 3A, in some embodiments the electrodes are disposed vertically and extend towards the top (e.g., atmospheric environment) where they may be connected to electrical connectors to receive activation/deactivation signals (e.g., from an external power source). In some embodiments, the electrodes cover most of a surface area of the base structure 302. As is discussed in other embodiments, more than a single pair of electrodes may be used. For example, two pairs of electrodes, three pairs of electrodes, and so forth may be used. In some embodiments, eight pairs of electrodes are used. Neighboring electrodes (e.g., adjacent electrodes) may be separated by a gap. The multiple pairs of electrodes may be connected in parallel such as, for example, to coordinate activation and deactivation of the neighboring electrodes. The holding structure 331 may have an auxiliary horizontal electrode (e.g. electrode formed into a loop) buried inside walls 333 connected to other auxiliary electrodes in the top of the holding structure 331. Auxiliary electrodes may be connected to one another in rows.

Figure 3B:
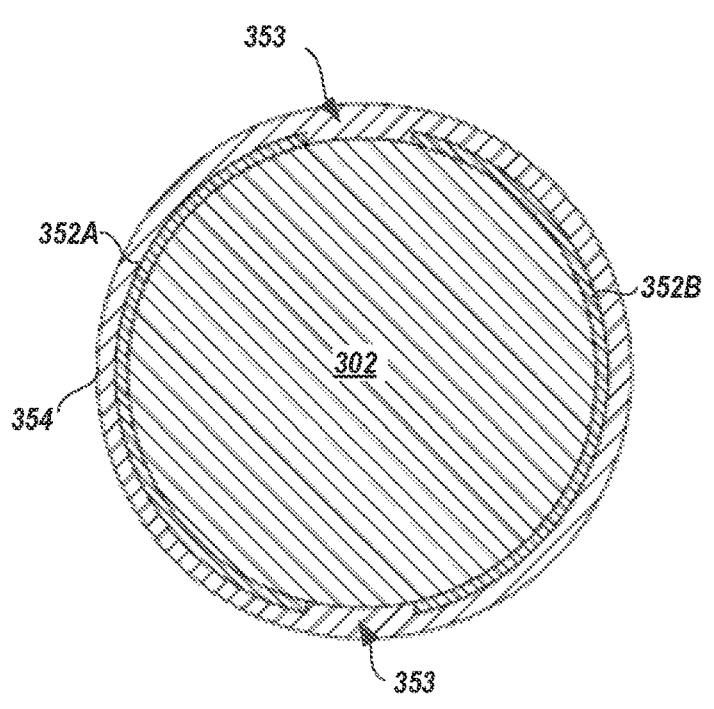
FIG. 3B illustrates a cross sectional view of a plasma generating cell of a stackable plasma source, according to certain embodiments.
Figure 3C:
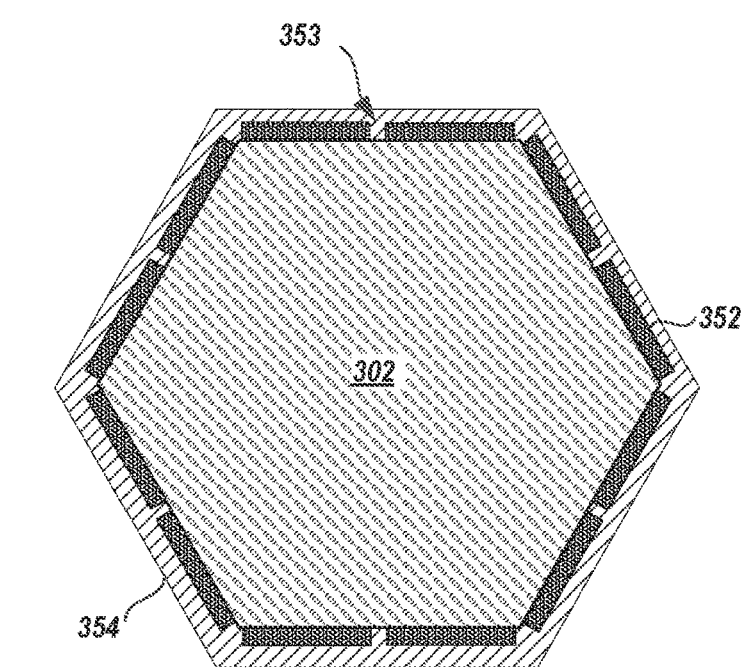
FIG. 3C illustrates a cross sectional view of a plasma generating cell of a stackable plasma source, according to certain embodiments.

FIG. 3B illustrates a cross sectional view of a plasma generating element 300B of a plasma source 300A, according to certain embodiments. Plasma generating element 300B may correspond to plasma generating element 301 in some embodiments. In some embodiments, a cross section of the base structure 302 is a circle (e.g., as illustrated in FIG. 3B). However, in some embodiments, base structure 302 may have an oval cross section, a triangle cross section, a square cross section, a rectangle cross section, a pentagon cross section, or a hexagon cross section (e.g., as shown in FIG. 3C). In some embodiments, base structure 302 includes multiple flat faces. In some embodiments, the cross section of base structure 302 is between approximately 5 mm and 30 mm across. For example, the cross section of base structure 302 may have a diameter of between approximately 5 mm and 30 mm. As discussed herein, the base structure 302 may be bounded in part (e.g., a first portion of the base structure 302) by a first electrode 352A and bounded in part (e.g., a second portion of the base structure 302) by a second electrode 352B. In some embodiments, the electrodes may extend around an azimuthal direction of the base structure 302 and in other embodiments, the electrodes may extend along a later direction (e.g., as seen in FIG. 3B).

In some embodiments, each of electrodes 352 may form a patterned electrode layer around the circumference of base structure 302. In some embodiments, as described herein, electrodes 352 may be deposited on a surface of the base structure 302. In some examples, the electrodes 352 are deposited by a metallizing process, an electron beam ion assisted deposition (EB-IAD) process, or another process as described herein. In some embodiments, the electrodes 352 may be between approximately 0.1 microns and 20 microns thick.

In some embodiments, the first electrode 352A and the second electrode 352B are separated by gaps 353. In some embodiments, each of the gaps 353 have a gap size of approximately 0.5 mm and 8 mm. In embodiments where there are multiple pairs of electrodes, a gap 353 separates each adjacent electrode. Different pairs of electrodes may have gaps of the same size or gaps of different sizes in some embodiments. As shown in FIG. 3B, the electrodes and base structure may be covered by a cover layer 354 that may include a dielectric material. Cover layer 354 may include a first layer and/or a second layer as described herein. In some embodiments, cover layer 354 is deposited over a region of the electrodes 352 (e.g., a region of the patterned electrode layer) to form a dielectric layer. The dielectric layer may be deposited by plasma spray (PS) techniques, and/or by physical vapor deposition (PVD) techniques as described herein. In some embodiments, the dielectric layer (e.g., cover layer 354) is between approximately 25 microns and 1000 microns thick. In some embodiments, cover layer 354 is made up of a dielectric oxide layer (e.g., a first layer). The dielectric oxide layer may be of a material selected from a group including alumina, yttria, and/or magnesia. In some embodiments, cover layer 354 additionally includes a metal oxide layer (e.g., a second layer) deposited over the dielectric layer. The metal oxide layer may include alumina and/or yttria.

FIG. 3C illustrates a cross sectional view of a plasma generating element 300C of a stackable plasma source 300A, according to certain embodiments. Plasma generating element 300C may correspond to plasma generating element 301 in embodiments. In some embodiments, base structure 302 (e.g., a substrate) has a hexagonal cross section as shown and described herein. In some embodiments, base structure 302 has a triangular cross section, a square cross section, a rectangular cross section, a pentagonal cross section, etc. Electrodes 352 may be deposited on the flat faces of base structure 302. Depositing the electrodes 352 on the flat faces of the base structure 302 may reduce costs associated with depositing the electrodes 352 when compared to depositing the electrodes 352 on curved surfaces (e.g., such as when base structure 302 has a circular or ovular cross section). In some embodiments, the flat faces of the base structure 302 may have a width between approximately 4 mm and 15 mm.

Figure 3D:
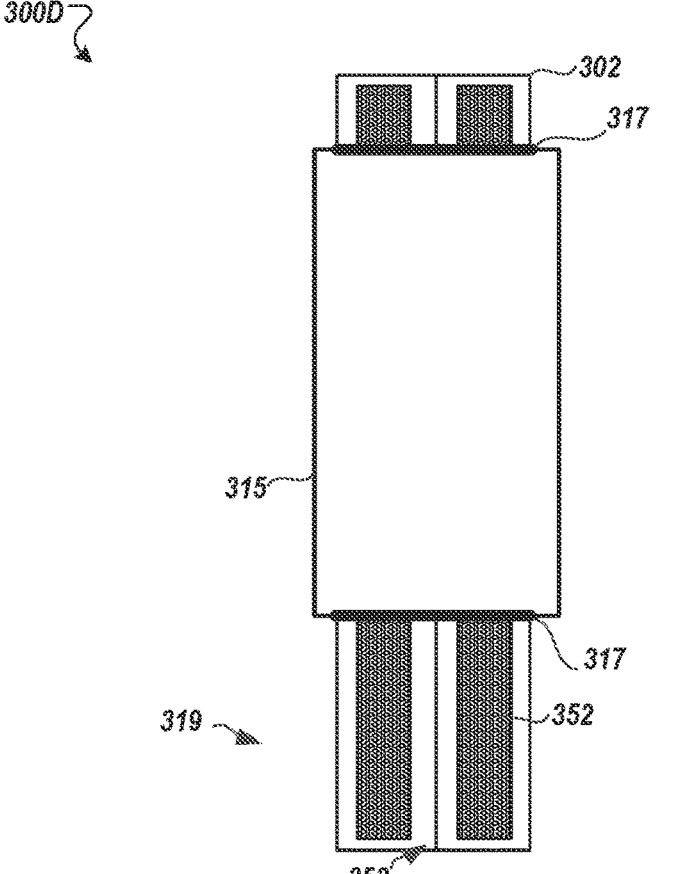
FIG. 3D illustrates a side view of a plasma generating cell of a stackable plasma source, according to certain embodiments.

FIG. 3D illustrates a side view of a plasma generating element 300D of a stackable plasma source 300A, according to certain embodiments. Plasma generating element 300D may correspond to plasma generating element 301, plasma generating element 300B and/or plasma generating element 300C in embodiments. In some embodiments, the electrodes 352 are deposited on flat faces of the base structure 302. A dielectric layer may be deposited over the electrodes 352 and the gaps 353 to form a DBD region 319. In some embodiments, a dielectric sleeve 315 is deposited over the electrodes 352 to form an insulating region. The dielectric sleeve 315 may at least partially overlap the deposited dielectric layer. In some embodiments, the dielectric sleeve 315 is an electrical insulator to insulate the electrodes 352 from a support structure (e.g., holding structure 331, connection structure 321). Vacuum seals 317 may be deposited at the ends of the dielectric sleeve 315 to seal the interface of the dielectric sleeve 315 and the dielectric layer (not shown), and/or to seal the interface of the dielectric sleeve 315 and the (upper) end of the base structure 302 and electrodes 352. In one embodiment, a vacuum seal is achieved by applying an epoxy or other bonding material between the dielectric sleeve and the base structure 302. The epoxy or other bonding material may form a bond with the base structure 302 that is sufficient to maintain a vacuum. In some embodiments, the electrodes 352 extend upwards from beneath the dielectric sleeve 315 approximately 1-10 cm opposite the DBD region 319. In some embodiments, the electrodes 352 may extend from beneath the dielectric sleeve 315 more than 1 cm or less than 1 cm to interface with an electrical connector (e.g., to couple the electrodes 352 to an external power source). The electrodes 352 may be configured to conduct electricity from the top distal end (as illustrated) to the DBD region 319.

Figures 4A, 4B:
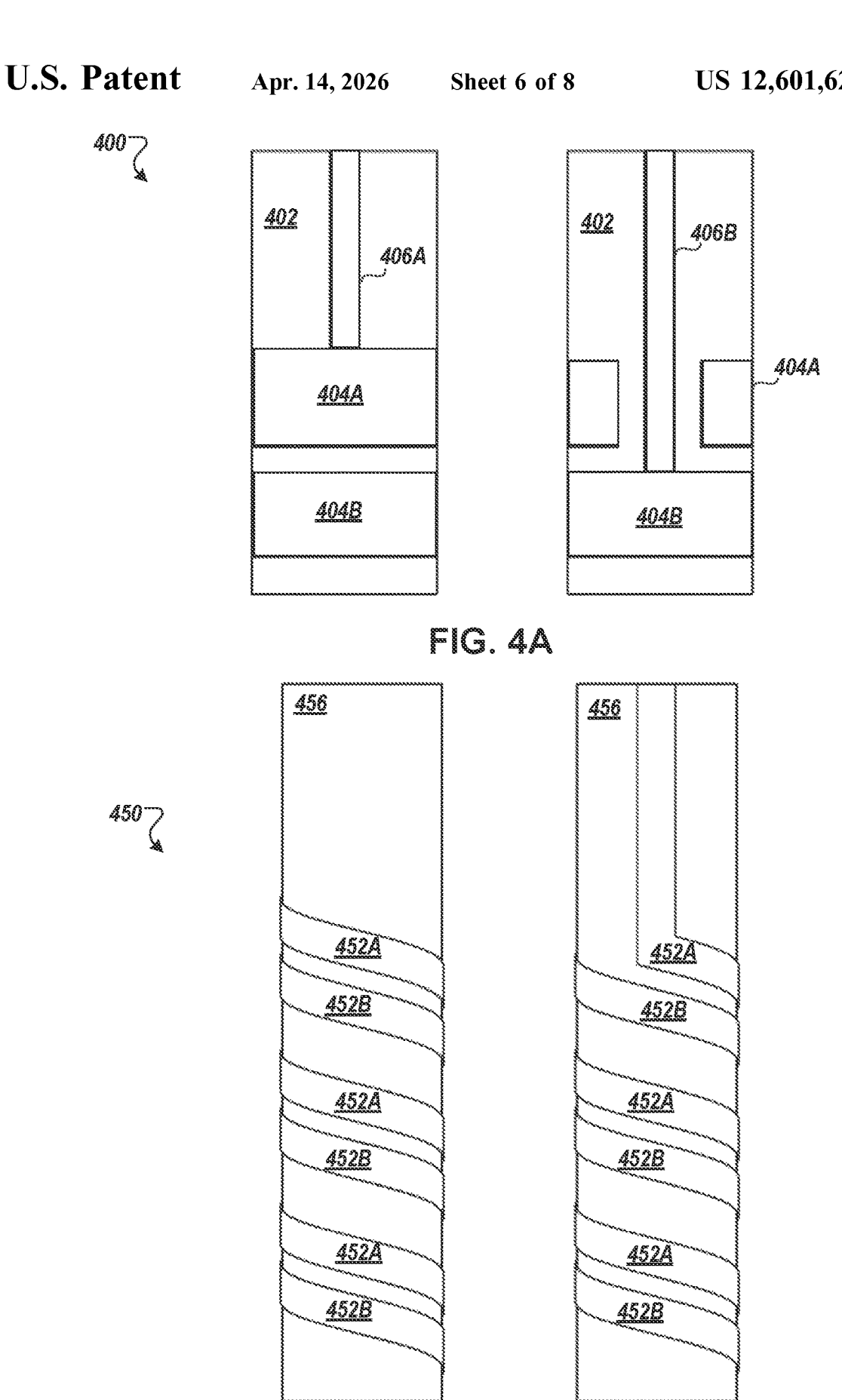
FIG. 4A-B illustrate embodiments of plasma generating cells of a stackable plasma source, according to certain embodiments.

FIGS. 4A-B illustrates electrode configurations of plasma generating cells 400A-B, according to certain embodiments. Plasma generating cells 400A-B may correspond to plasma generating cells 102 in embodiments.

In some embodiments, as shown in FIG. 4A, a first electrical lead 406A may be coupled to a first electrode 404A that wraps around an outer perimeter of the base structure 402. A second electrical lead 406B may be coupled to a second electrode 404B that wraps around an outer perimeter of the base structure 402. The two perimeters may be displaced a distance with a dielectric material between them. As shown in FIG. 4A an electrode 404A may wrap entirely around the base structure but form a gap so the lead 406B of another electrode may extend and receive activation/deactivation signals. Electrodes 404A and 404B may include one or more features and/or details of other electrodes described herein.

In some embodiments, as shown in FIG. 4B, electrodes 452A-B may be disposed along an outer surface of the base structure 456. The electrodes may extend around the base structure while advancing along a longitudinal direction of the base structure 456. For example, the electrode may be disposed in a helical structure (e.g., helical shape, spiral shape, etc.), as shown in FIG. 4B.

Figure 5C:
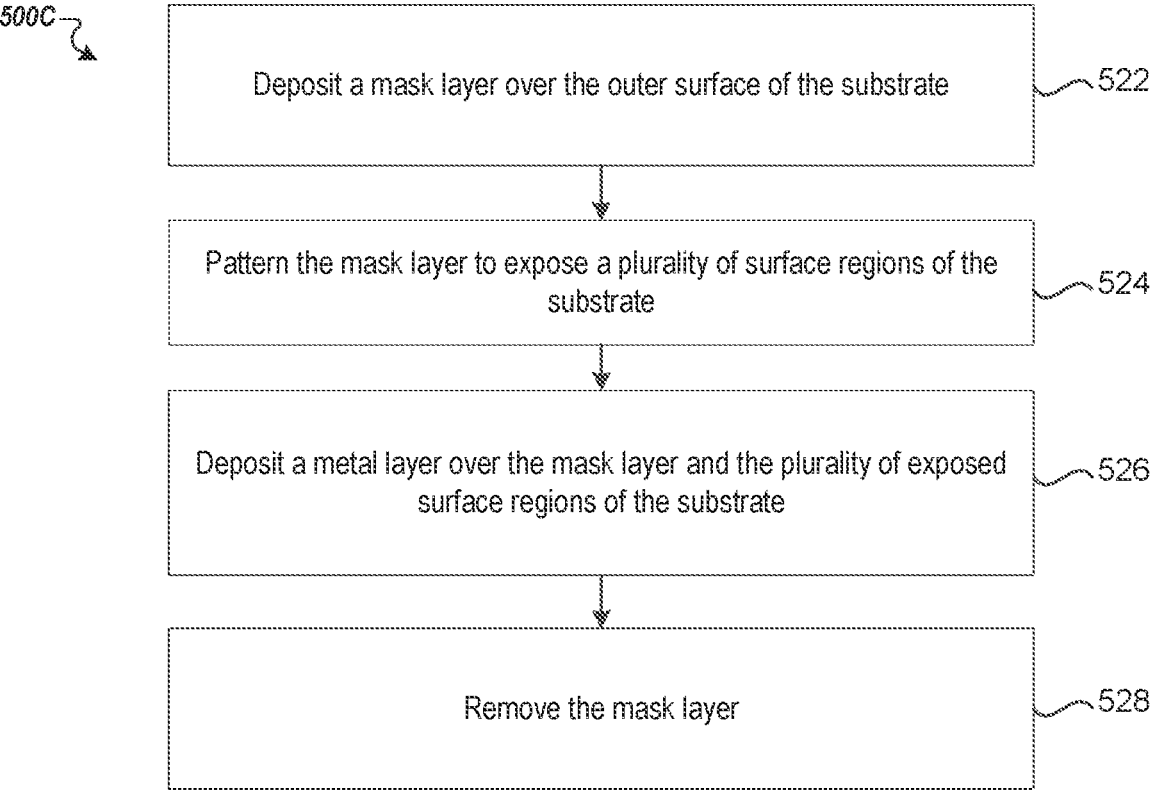

FIGS. 5A-C are flow charts of methods of manufacturing a plasma generating cell of a stackable plasma source, according to certain embodiments. The methods of FIGS. 5A-C may be used to manufacture the plasma generating cells shown and described with reference to any of the preceding figures. FIG. 5A is a flow chart of a method 500A of manufacturing a plasma generating cell of a stackable plasma source, according to certain embodiments. FIG. 5B is a flow chart of a method 500B of forming a patterned electrode layer on a plasma generating cell, according to certain embodiments. FIG. 5C is a flow chart of a method 500C of forming a patterned electrode layer on a plasma generating cell by a masking process, according to certain embodiments.

Referring to FIG. 5A, at block 502, a patterned electrode layer may be formed around an outer perimeter of a dielectric substrate or rod (e.g., base structure 302 of FIGS. 3A-D). In some embodiments, the patterned electrode layer may be formed by a deposition process, a machining process, and/or a masking process as described herein. In some embodiments, the patterned electrode layer includes multiple pairs of electrodes (e.g., one to eight pairs of electrodes, electrodes 352 of FIGS. 3A-D). The electrodes may substantially surround the perimeter of the substrate. The electrodes may extend from a first end of the substrate to an opposite second end of the substrate (e.g., from a top to a bottom of a rod-shaped substrate).

Adjacent electrodes (e.g., neighboring electrodes) may be separated by a gap (e.g., gap 353 of FIGS. 3B-D). Each of the gaps may be formed by a machining process and/or a masking process as described herein. In some embodiments, each of the gaps are between approximately 0.5 mm and 8 mm wide as described herein. In some embodiments, each of the gaps are between approximately 1 mm and 6 mm wide. However, in some embodiments, each of the gaps are between approximately 2 mm and 5 mm wide. Different pairs of electrodes may have gaps of a same size or gaps of different sizes. In some embodiments, the patterned electrode layer has a thickness between approximately 0.1 microns and 20 microns as described herein. In some embodiments, the patterned electrode layer has a thickness between approximately 0.5 microns and 10 microns. In some embodiments, the patterned electrode layer has a thickness between approximately 0.3 microns and 1 micron (e.g., where the patterned electrode layer is made up of ITO or a metal alloy on a polished quartz substrate). In some embodiments, the patterned electrode layer has a thickness between approximately 6 microns and 14 microns (e.g., where the patterned electrode layer is made up of metallized metal on an alumina substrate). In some embodiments, the patterned electrode layer is made up of a metal or a metal alloy. In some examples, the patterned electrode layer is made up of a manganese-molybdenum alloy and/or a silver-palladium alloy and/or any alloy of chromium, nickel and/or silver. In some embodiments, the patterned electrode layer may include other metals and/or materials as described herein. In some examples, the patterned electrode layer may include one or more of TiN, $TiB_2$, $MoSi_2$, $BaTiO_3$, $(Fe, Ti)_2O_3$, $ReO_3$, $RuO_2$, $IrO_2$, $TiO$, $V_2O_3+Ti$, and so on. In some embodiments, the patterned electrode layer includes Inconel or other high-temperature nickel-based and/or cobalt-based superalloys. In some embodiments the patterned electrode layer may include a sandwich structure. For example, the sandwich structure may include a main conductor layer sandwiched between two thin layers of another metal (e.g., Cr, etc.). In some examples, the sandwich structure may include a structure such as Cr—Cu—Cr, Cr—Ag—Cr, Cr—Au—Cr, Cr—Ir—Cr. In some embodiments, the patterned electrode layer may include a conductive oxide layer and/or a conductive ceramic layer.

At block 504, a first dielectric layer (e.g., dielectric layer 454 of FIGS. 4A-B) may be deposited over a region (e.g., a first region) of the patterned electrode layer. The dielectric layer deposited over the region of the patterned electrode layer may form a dielectric barrier discharge (DBD) region of the plasma generating cell (e.g., DBD region 319 of FIG. 3D). In some embodiments, the dielectric layer may have a thickness between approximately 25 microns and 1000 microns as described herein. In some embodiments, the dielectric layer has a thickness between approximately 20 microns and 200 microns. In some embodiments, contact pads of the patterned electrode layer (e.g., electrode connection pads, connecting regions, etc.) may be masked during the deposition of the dielectric layer. The contact pads may be disposed at an upper end of the substrate and may be configured to electrically couple the electrodes to a power source as described herein.

Coatings (e.g., metal layers, electrode layers, dielectric layers, dielectric sleeves, etc.) according to embodiments described herein may be formed using a deposition process selected from chemical vapor deposition (CVD), plasma enhanced chemical vapor deposition (PECVD), physical vapor deposition (PVD), plasma enhanced physical vapor deposition (PEPVD) and atomic layer deposition (ALD). CVD is a well-known technique for depositing pure metal coatings. In a typical CVD process, a substrate is exposed to at least one volatile precursor under ultra-high vacuum conditions. The at least one precursor reacts or decomposes on the substrate surface to form a film. The reaction chamber is subsequently purged with inert gas flowing there-through. In a PECVD process, chemical reactions are initiated by the creation of a plasma of the reactive precursor gases. In an ALD process, a thin film layer is grown by repeatedly exposing the surface of a substrate to pulses of gaseous chemical precursors that chemically react with the surface one at a time in a self-limiting manner. CVD and ALD are non-line-of-sight processes that may be used to coat high aspect ratio features. A PVD process also takes place under vacuum conditions and typically involves sputtering and/or evaporation of a target material to form a gas that deposits and/or reacts on a surface of the substrate. PVD (typically, including evaporation, plasm spray, etc.) is a line-of-sight process. In a PEPVD process (typically, including ion assisted deposition, ion assisted evaporation deposition, ion assisted sputtering deposition, ion plating, etc.), the plasma or energetic ions are generated to react with deposition materials from the PVD processes, such as the ion beams, and involve sputtering or evaporation of target materials. PEPVD is a line-of-sight process, but can be modified as a non-line-of-sight process in cases where the substrate is biased during the deposition processes. As compared to ALD, PVD and PEPVD can deposit a relatively thick coating (up to about 500 μm, or up to about 250 μm, or from about 5 μm to about 250 μm) at a relatively low deposition temperature (<200° C.).

In some embodiments, the dielectric layer is deposited by a glaze process (e.g., a glazing process). A glaze process may be similar (e.g., substantially similar) to a dip coating process. In some examples, the substrate having the patterned electrode layer may be dipped into a solution (e.g., the coating solution, the glaze solution, etc.) and subsequently removed from the solution. The solution may cure on the substrate and the patterned electrode layer. In some embodiments, the solution is dried or heated (e.g., the substrate may be "fired," etc.) to cure the solution on the substrate and the patterned electrode layer. In some embodiments, the dielectric layer deposited by the glaze process is one of silica or alumina. In some embodiments, a first protective layer (e.g., thin oxide layer) may be deposited on the substrate and/or the patterned electrode layer prior to the glaze process as described below.

In some embodiments, the dielectric layer includes an oxide layer. In some examples, the oxide layer may include a material selected from one of alumina (e.g., $Al_2O_3$), yttria ($Y_2O_3$), and/or magnesia (MgO). The oxide layer may be deposited by processes as described herein.

In some embodiments a second dielectric layer is formed over the first dielectric layer at block 505. The second dielectric layer includes a metal oxide layer (e.g., a rare earth metal oxide layer) in embodiments. The metal oxide layer may include a material selected from alumina or yttria. The metal oxide layer may be deposited by processes as described herein. The first dielectric layer and second dielectric layer may be deposited by a same deposition process or by different deposition processes. The second dielectric layer may be a protective layer deposited on top of the first dielectric layer to protect the first dielectric layer. In some examples, the second dielectric layer may be stronger (e.g., more plasma resistant, etc.) than the first dielectric layer. The first dielectric layer and the second dielectric layer may comprise the same material or different materials (e.g., different oxides). In one embodiment, the first dielectric layer comprises alumina, yttria or magnesia, and the second dielectric layer comprises alumina. The first dielectric layer may have a thickness of 25-200 microns, and the second dielectric layer may have a thickness of 10-50 microns in embodiments. In some embodiments, the first or second dielectric layer are deposited by atomic layer deposition (ALD).

In some embodiments, at least one of the first dielectric layer or the second dielectric layer comprises alumina, yttria, magnesia, $Y_2O_3$, $Er_2O_3$, $Y_3Al_5O_{12}$ (YAG), $Er_3Al_5O_{12}$ (EAG), yttria stabilized zirconia (YSZ), an $SiO_2$—$Al_2O_3$ mixture, or $Y_4Al_2O_9$ (YAM). The rare-earth metal-containing oxide layer may also be $YAlO_3$ (YAP), $Er_4Al_2O_9$ (EAM), $ErAlO_3$ (EAP), a solid-solution of $Y_2O_3$—$ZrO_2$ and/or a ceramic compound comprising $Y_4Al_2O_9$ and a solid-solution of $Y_2O_3$—$ZrO_2$.

With reference to the solid-solution of $Y_2O_3$—$ZrO_2$, the rare-earth metal-containing oxide layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

Any of the aforementioned rare-earth metal-containing oxide layers may include trace amounts of other materials such as $ZrO_2$, $HfO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

At block 506, a dielectric sleeve (e.g., stem structure 414 of FIG. 4A) may be positioned over a region (e.g., a second region) of the patterned electrode layer. The dielectric sleeve may be an insulating layer to electrically insulate the patterned electrode layer (e.g., electrodes 452 of FIGS. 4A-B). In some embodiments, the dielectric sleeve forms an insulating region of the plasma generating cell. In some examples, the dielectric sleeve insulates the electrodes from the connection structure (e.g., connection structure 406 of FIG. 4A, a cover structure, a metal plate, a top of a processing chamber, etc.) of the stackable plasma source. The dielectric sleeve may at least partially overlap with the dielectric layer deposited at block 504. The dielectric sleeve may have a thickness greater than a thickness of the dielectric layer as described herein. In some examples, the dielectric sleeve may have a thickness in excess of 200 microns. In some embodiments, the substrate having the patterned electrode layer is inserted into the dielectric sleeve. In some embodiments, the dielectric sleeve is deposited on the patterned electrode layer (e.g., covering the electrodes and gaps). The dielectric sleeve may partially overlap with the dielectric layer. In some embodiments, the dielectric sleeve is made of dielectric materials as described herein (e.g., alumina, yttria, magnesia, etc.). In some embodiments, approximately 1 cm of the substrate and patterned electrode layer may be left uncovered by the dielectric sleeve and/or the dielectric layer to facilitate electrical connection of the electrodes to an external power source.

At block 508, a gap filler (e.g., vacuum seal 417 of FIG. 4D) may be applied to the edges of the dielectric sleeve and/or to a gap between the dielectric sleeve and the dielectric substrate. The gap filler may be applied to fill any gap between the dielectric sleeve and the substrate. The gap filler may be applied to bond the dielectric sleeve to the patterned electrode layer, to the dielectric layer, and/or to the substrate. In some embodiments, the gap filler may be an epoxy, a dielectric adhesive (e.g., dielectric glue), a dielectric epoxy, and/or a dielectric glass. In some embodiments, the gap filler is applied using vacuum infiltration. In some embodiments, the gap filler is injected into a gap between the dielectric sleeve and the substrate. In some embodiments, the gap filler is a glass frit that is packed into a gap between the dielectric sleeve and the substrate. The glass frit may then be cured by firing (e.g., heated, such as in a kiln, etc.). In some embodiments, the gap filler may be painted onto the substrate (e.g., and/or onto the patterned electrode layer) and the dielectric sleeve is pushed over the substrate and the gap filler. The gap filler may form a vacuum seal at an interface between the dielectric sleeve deposited at block 506 and the dielectric layer deposited at block 504. Subsequent to the applying and curing the gap filler, the plasma cell may be cleaned and/or readied for ultra-high vacuum (UHV) processing.

FIG. 5B is a flow chart of a method 500B of forming a patterned electrode layer on a plasma generating cell, according to certain embodiments. Method 500C may be performed, for example, at block 502 of method 500A. At block 512, the outer surface of the substrate may be prepared. In some examples, the outer surface of a dielectric substrate (e.g., an alumina substrate) or rod is roughened in preparation for a metal to be deposited on the roughened surface of the substrate at block 514. In some embodiments, the roughening of the substrate's outer surface may be accomplished by an abrasive machining operation (e.g., grinding, etc.) and/or by a grit blasting process (e.g., sand blasting, media blasting, etc.).

In some embodiments, the outer surface of the substrate may be prepared by polishing. In some examples, the outer surface of the substrate is smoothed by a polishing operation to form a smoothed surface. In some examples, the outer surface of a sapphire substrate or a quartz substrate (e.g., fused quartz substrate) is polished in preparation for a metal to be deposited on the substrate at block 514 (e.g., prior to an EB-IAD operation). In some embodiments, the polishing of the substrate's surface may be accomplished by a machining operation, and/or by a flame polishing operation. Flame polishing may include exposing the surface of the substrate to a flame and/or heat to briefly melt the surface of the substrate. Surface tension of the melted surface may then smooth the surface.

At block 514, a metal may be deposited on the outer surface of the substrate. The metal may be deposited to form an electrode layer on the outer surface of the substrate. In some embodiments, the metal may be deposited on the substrate by a dip coating process, by a painting process, and/or by a screen printing process. In some embodiments, the metal is deposited by a PVD process (e.g., sputter coating). In some embodiments, the metal is deposited by an electroless plating (EP) process. The metal may be deposited by the foregoing processes on a dielectric substrate such as an alumina substrate, or a yttria substrate. The metal may be one of a manganese-molybdenum alloy, a silver-palladium alloy, copper, gold, palladium platinum, and/or silver. Other electrically conductive materials may also be used, which may be other metals or other conductive materials (e.g., conductive oxides, conductive ceramics, etc.). In some embodiments, the metal may be metallized on the surface of the substrate by a heated metallizing process (e.g., a metallization process). The metal (e.g., or conductive material, conductive oxide, conductive ceramic, etc.) may react with silicon in the substrate during the metallizing process to form a metal silicide layer on the surface of the substrate. In some embodiments, the metal is deposited on the substrate by an EB-IAD process. The metal deposited by the EB-IAD process may include at least one of Cr, Ni, Au, Cu, Ag, Pd, Pt, indium tin oxide (ITO), TiN, $TiB_2$, $MoSi_2$, $BaTiO_3$, $Fe_2O_3$, $TiO_3$, $ReO_3$, $RuO_2$, $IrO_2$, TiO, or $V_2O_3$.

At block 516, the electrode layer (e.g., deposited at block 514) may be patterned to form a patterned electrode layer (e.g., electrodes 352 of FIGS. 3A-B). In some embodiments, the electrode layer may be patterned using a process selected from a group consisting of a machining operation, a laser etching operation, and/or a masking operation. In some examples, portions of the electrode layer may be removed (e.g., by a machining tool and/or by a laser etching tool) to form gaps in the electrode layer (e.g., gaps 353 of FIGS. 3B-D).

In some examples, a masking operation to pattern the electrode layer includes depositing a mask over the electrode layer deposited on the surface of the substrate. The mask may then be patterned. The mask may be patterned, for example, via selective exposure to radiation (e.g., via lithography). An etch process may then be performed to etch only the portions of the mask exposed to the radiation or only the portions of the mask not exposed to the radiation, leaving behind exposed portions of the electrode layer. Exposed portions of the electrode layer (e.g., portions of the electrode layer exposed by the patterned mask) may be etched (e.g., by an etching process such as a plasma etching process, an acid etching process, a laser etching process, a chemical etching process, etc. to form gaps 353). Upon completion of the etching, the mask may be removed.

Patterning the electrode layer may form gaps (e.g., gaps 353 of FIGS. 3B-D) between individual electrodes. In some embodiments, one to eight pairs of electrodes are formed in the electrode layer by the patterning operations, each adjacent electrode pair being separated by a gap. In some embodiments, more than eight pairs of electrodes are formed in the electrode layer.

FIG. 5C is a flow chart of a method 500C of forming a patterned electrode layer on a plasma generating cell by a masking process, according to certain embodiments. Method 500C may be performed, for example, at block 502 of method 500A. At block 522, a mask layer may be deposited over the outer surface of a substrate (e.g., such as a rod). The mask layer may be deposited about the circumference (e.g., the outer perimeter) of the substrate.

At block 524, the mask layer may be patterned to expose multiple surface regions of the substrate. In some examples, each surface region corresponds to a portion of the substrate surface where an electrode will be deposited (e.g., at block 526). The exposed surface regions may be electrode regions on the surface of the substrate. In some embodiments, the surface regions of the substrate are disposed on flat surfaces of the substrate (e.g., in embodiments where the substrate includes flat surfaces, such as when the substrate is a rod having a triangle cross section, a square cross section, a rectangle cross section, a pentagon cross section, or a hexagonal cross section as illustrated in FIG. 3C, etc.). Adjacent surface regions may be separated by a distance of 0.5 mm to 8 mm in some embodiments.

At block 526, a metal layer may be deposited over the mask layer (e.g., by an EB-IAD process, by a print process, etc.) and the multiple exposed surface regions of the substrate. The metal layer may be deposited onto the surface of the substrate to form individual electrodes (e.g., one to eight pairs of electrodes in some embodiments). In some embodiments, a conductive material layer may be deposited over the mask layer and the multiple exposed surface regions of the substrate. In some examples, a conductive oxide layer or a conductive ceramic layer may be deposited to form the individual electrodes.

At block 528, the mask layer may be removed, leaving electrodes (e.g., electrodes 352 of FIGS. 3A-4B) and gaps between adjacent electrodes (e.g., gaps 353 of FIG. 3B). After removing the mask layer, the patterned electrode layer may remain on the substrate.

The preceding description sets forth numerous specific details such as examples of specific systems, components, methods, and so forth, in order to provide a good understanding of several embodiments of the disclosure. It will be apparent to one skilled in the art, however, that at least some embodiments of the disclosure may be practiced without these specific details. In other instances, well-known components or methods are not described in detail or are presented in simple block diagram format in order to avoid unnecessarily obscuring the disclosure. Thus, the specific details set forth are merely exemplary. Particular implementations may vary from these exemplary details and still be contemplated to be within the scope of the disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method of manufacturing a dielectric barrier discharge (DBD) structure, the method comprising:
   forming a patterned electrode layer around an outer surface of a substrate composed of a dielectric material, wherein the substrate is a dielectric rod, the patterned electrode layer comprising a plurality of electrodes around the outer surface of the substrate and gaps between adjacent electrodes of the plurality of electrodes, wherein the plurality of electrodes extend longitudinally along the dielectric rod from a first end of the dielectric rod to a second end of the dielectric rod; and
   depositing a dielectric layer over at least a first region of the patterned electrode layer to form a DBD region of the DBD structure.

2. The method of claim 1, further comprising:
   positioning a dielectric sleeve over at least a second region of the patterned electrode layer to form an insulating region of the DBD structure, wherein a first thickness of the dielectric sleeve is greater than a second thickness of the dielectric layer; and
   applying a gap filler to fill any gap between the dielectric sleeve and the substrate and to bond the dielectric sleeve to the substrate.

3. The method of claim 1, wherein the patterned electrode layer is between approximately 0.1 microns and 20 microns thick, and wherein the dielectric layer is between approximately 25 and 1000 microns thick.

4. The method of claim 1, further comprising:
depositing an electrically conductive material on the outer surface of the substrate to form an electrode layer; and
patterning the electrode layer to form the patterned electrode layer, wherein the patterned electrode layer comprises one to eight pairs of electrodes.

5. The method of claim 4, wherein patterning the electrode layer is performed using a process selected from a group consisting of:
a) machining;
b) laser etching; and
c) depositing a mask layer over the electrode layer;
patterning the mask;
etching portions of the electrode layer exposed by the patterned mask; and
removing the mask.

6. The method of claim 4, further comprising:
roughening a surface of the substrate along an outer perimeter of the substrate; and
performing a metallization process to deposit the metal on the roughened surface.

7. The method of claim 4, wherein depositing the electrically conductive material comprises performing electron beam ion assisted deposition (EB-IAD) to deposit the electrically conductive material, wherein the electrically conductive material comprises at least one of a metal, a metal alloy, a conductive oxide, or a conductive ceramic.

8. The method of claim 7, wherein the electrically conductive material comprises at least one of Cr, Ni, Au, Cu, Ag, Pd, Pt, ITO, TiN, $TiB_2$, $MoSi_2$, $BaTiO_3$, $Fe_2O_3$, $TiO_3$, $ReO_3$, $RuO_2$, $IrO_2$, TiO, or $V_2O_3$.

9. The method of claim 7, further comprising:
polishing a surface of the substrate along an outer perimeter of the substrate prior to performing the EB-IAD.

10. The method of claim 1, wherein the patterned electrode layer comprises one of a manganese-molybdenum alloy or a silver-palladium alloy.

11. The method of claim 1, wherein the dielectric layer comprises a first oxide layer selected from a group comprising alumina, yttria, silica, and magnesia.

12. The method of claim 1, wherein depositing the dielectric layer comprises performing a plasma spray (PS) process, a physical vapor deposition (PVD) process, or a glaze process.

13. The method of claim 1, further comprising:
depositing a metal oxide layer over the dielectric layer.

14. The method of claim 13, wherein the metal oxide layer comprises at least one of alumina or yttria.

15. The method of claim 1, wherein forming the patterned electrode layer comprises:
depositing a mask layer over the outer surface of the substrate;
patterning the mask layer to expose a plurality of surface regions of the substrate;

depositing a metal layer over the mask layer and the plurality of exposed surface regions of the substrate; and
removing the mask layer.

16. The method of claim 1, wherein a cross section of the substrate has a shape selected from a group consisting of a circle, an oval, a square, a rectangle, a pentagon, and a hexagon.

17. The method of claim 1, wherein each of the gaps has a gap size of between 0.5 mm and 8 mm.

18. The method of claim 1, wherein the dielectric material comprises at least one of alumina, quartz, or sapphire.

19. A method comprising:
roughening an outer surface of a dielectric rod by an abrasive machining operation or a media blasting operation to form a roughened outer surface of the dielectric rod;
depositing an electrode layer on the roughened outer surface of the dielectric rod by a metallization process or by an electron beam ion assisted deposition (EB-IAD) process, wherein the electrode layer comprises at least one of a metal, a metal alloy, or a conductive oxide;
removing at least a portion of the electrode layer by a machining process or by an etching process to form a plurality of gaps in the electrode layer, wherein each gap of the plurality of gaps separates an electrode from an adjacent electrode, and wherein the electrode and the adjacent electrode extend longitudinally along the dielectric rod from a first end of the dielectric rod to a second end of the dielectric rod; and
depositing a dielectric layer over at least a first region of the electrode layer to form a dielectric barrier discharge region.

20. A method comprising:
smoothing a surface of a dielectric rod by a polishing operation to form a smoothed surface of the dielectric rod;
depositing a mask layer over at least the smoothed surface of the dielectric rod;
patterning the mask layer to expose a plurality of electrode regions on the smoothed surface of the dielectric rod;
depositing a metal layer or a conductive oxide layer over the mask layer and the plurality of electrode regions to form a plurality of electrodes on the plurality of electrode regions;
removing the mask layer to form a plurality of gaps, wherein each gap of the plurality of gaps separates an electrode from an adjacent electrode; and
depositing a dielectric layer over at least a first region of the plurality of electrodes to form a dielectric barrier discharge region,
wherein the electrode and the adjacent electrode extend longitudinally along the dielectric rod from a first end of the dielectric rod to a second end of the dielectric rod.

* * * * *